(12) United States Patent
Yamamoto

(10) Patent No.: US 7,899,568 B2
(45) Date of Patent: Mar. 1, 2011

(54) SUBSTRATE PROCESSING METHOD, SUBSTRATE PROCESSING SYSTEM, AND COMPUTER-READABLE STORAGE MEDIUM

(75) Inventor: Yuichi Yamamoto, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 12/108,094

(22) Filed: Apr. 23, 2008

(65) Prior Publication Data

US 2008/0269937 A1    Oct. 30, 2008

(30) Foreign Application Priority Data

Apr. 27, 2007    (JP) .................. 2007-119079

(51) Int. Cl.
*G06F 19/00*    (2006.01)
(52) U.S. Cl. ........... 700/112; 700/96; 700/100; 700/121; 414/935
(58) Field of Classification Search .................. 700/14, 700/96, 100–102, 108, 112, 114, 121, 213, 700/214, 218; 414/935, 937, 939
See application file for complete search history.

(56) References Cited

U.S. PATENT DOCUMENTS

| | | | | |
|---|---|---|---|---|
| 4,052,603 A | * | 10/1977 | Karlson | 700/192 |
| 5,858,863 A | * | 1/1999 | Yokoyama et al. | 438/514 |
| 6,873,878 B2 | * | 3/2005 | Liu et al. | 700/111 |
| 2005/0256599 A1 | * | 11/2005 | Peng | 700/100 |

FOREIGN PATENT DOCUMENTS

| | | |
|---|---|---|
| JP | 2926592 | 5/1999 |
| JP | 2006-287178 | 10/2006 |

* cited by examiner

*Primary Examiner* — Sean P Shechtman
(74) *Attorney, Agent, or Firm* — Oblon, Spivak, McClelland, Maier & Neustadt, L.L.P.

(57) ABSTRACT

A substrate processing system of the present invention includes a transfer-in/out section for transferring-in/out a substrate and a processing section for performing a plurality of processing and treatments on the substrate, in which a throughput of substrate processing at a pre-stage performed from when the substrate is transferred in from the transfer-in/out section to when the substrate is transferred out to the external apparatus is set higher than a throughput of substrate processing at a post-stage performed from when the substrate is returned from the external apparatus into the processing section to when the substrate is returned into the transfer-in/out section.

9 Claims, 6 Drawing Sheets

SUBSTRATE PROCESSING METHOD, SUBSTRATE PROCESSING SYSTEM, AND COMPUTER-READABLE STORAGE MEDIUM

BACKGROUND OF THE INVENTION

1. Field of the Invention

The present invention relates to a substrate processing method, a substrate processing system, and a computer-readable storage medium.

2. Description of the Related Art

The photolithography processing in manufacturing, for example, a semiconductor device is usually performed using a coating and developing treatment system. The coating and developing treatment system includes, for example, a cassette station for transferring in/out the wafer, a processing station in which a plurality of processing and treatment units performing a resist coating treatment, a developing treatment, thermal processing and so on are arranged, and an interface station for delivering the wafer to/from an adjacent aligner and the processing station, in which the aligner being a separate apparatus is in-lined.

In the coating and developing treatment system 1, a plurality of wafers are successively processed in a manner of single wafer processing. A plurality of wafers housed, for example, in a cassette in the cassette station are successively transferred to the processing station, and predetermined processing and treatment such as the resist coating treatment and the thermal processing are sequentially performed on each of the wafers in respective processing and treatment units in the processing station. Thereafter, each of the wafers is transferred via the interface station to the aligner and subjected to exposure processing. The wafer is then returned again into the processing station and subjected to predetermined processing or treatment such as the developing treatment in each of the processing and treatment units. The wafers are then successively returned from the processing station to the cassette station and housed into the cassette (Japanese Patent Application Laid-open No. 2006-287178).

SUMMARY OF THE INVENTION

However, in wafer processing at a pre-stage from when the wafer is transferred from the cassette station into the processing station to when it is transferred to the aligner, for example, the resist coating treatment is performed in the above-described coating and developing treatment system. The resist coating treatment is usually performed in a resist coating unit. The resist coating unit uses a resist solution which is likely to contaminate the inside thereof and needs to perform the treatment in a clean atmosphere, and therefore the unit needs to be subjected to maintenance such as cleaning and exchange of parts more frequently as compared to other units. For maintenance of the unit, it has been necessary to stop the operation of the whole coating and developing treatment system to stop the wafer processing. Therefore, frequent maintenance decreases the operating rate of the whole coating and developing treatment system, resulting in decreased productivity of wafer products.

The present invention has been developed in consideration of the above points, and its object is to suppress a decrease in productivity of substrate products due to performance of maintenance for units performing processing at the pre-stage in a substrate processing system in which processing is divided into the pre-stage and the post-stage as in the above-described coating and developing treatment system.

The present invention is a substrate processing method of, through use of a substrate processing system including a transfer-in/out section for transferring-in/out a substrate and a processing section for performing a plurality of processing and treatments on the substrate, performing in the processing section a first treatment on a substrate transferred thereinto from the transfer-in/out section, transferring the substrate out from the processing section to an external apparatus, then performing in the processing section a second treatment on the substrate returned from the external apparatus into the processing section, and returning the substrate into the transfer-in/out section, wherein a throughput of substrate processing at a pre-stage performed from when the substrate is transferred into the processing section from the transfer-in/out section to when the substrate is transferred out to the external apparatus is set higher than a throughput of substrate processing at a post-stage performed from when the substrate is returned from the external apparatus into the processing section to when the substrate is returned into the transfer-in/out section.

According to the present invention, the throughput of the substrate processing at the pre-stage is set higher than the throughput of the substrate processing at the post-stage, so that the substrate processing at the pre-stage for a fixed number of substrates finishes earlier than the substrate processing at the post-stage processing. This can ensure maintenance time for the units which perform the substrate processing at the pre-stage. Further, the substrates can be stored for which the substrate processing at the pre-stage has been finished and which wait for the substrate processing at the post-stage, so that it is possible to perform the substrate processing at the post-stage for the stored substrates to thereby continue the substrate processing while the maintenance is performed for the units which perform the substrate processing at the pre-stage. Accordingly, a decrease in productivity of substrate products due to maintenance can be suppressed.

The present invention according to another aspect is a substrate processing system including a transfer-in/out section for transferring-in/out a substrate and a processing section for performing a plurality of processing and treatments on the substrate, for performing in the processing section a first treatment on a substrate transferred thereinto from the transfer-in/out section, transferring the substrate out from the processing section to an external apparatus, then performing in the processing section a second treatment on the substrate returned from the external apparatus into the processing section, and returning the substrate into the transfer-in/out section, the system including a control unit controlling setting such that a throughput of substrate processing at a pre-stage performed from when the substrate is transferred into the processing section from the transfer-in/out section to when the substrate is transferred out to the external apparatus is higher than a throughput of substrate processing at a post-stage performed from when the substrate is returned from the external apparatus into the processing section to when the substrate is returned into the transfer-in/out section.

The present invention according to still another aspect is a computer-readable storage medium storing a program running on a computer of a control unit controlling a substrate processing system to cause the substrate processing system to execute the above-described substrate processing method.

According to the present invention, a decrease in substrate processing efficiency due to maintenance can be suppressed to improve the productivity of substrate products.

DETAILED DESCRIPTION OF THE INVENTION

Figure 1:
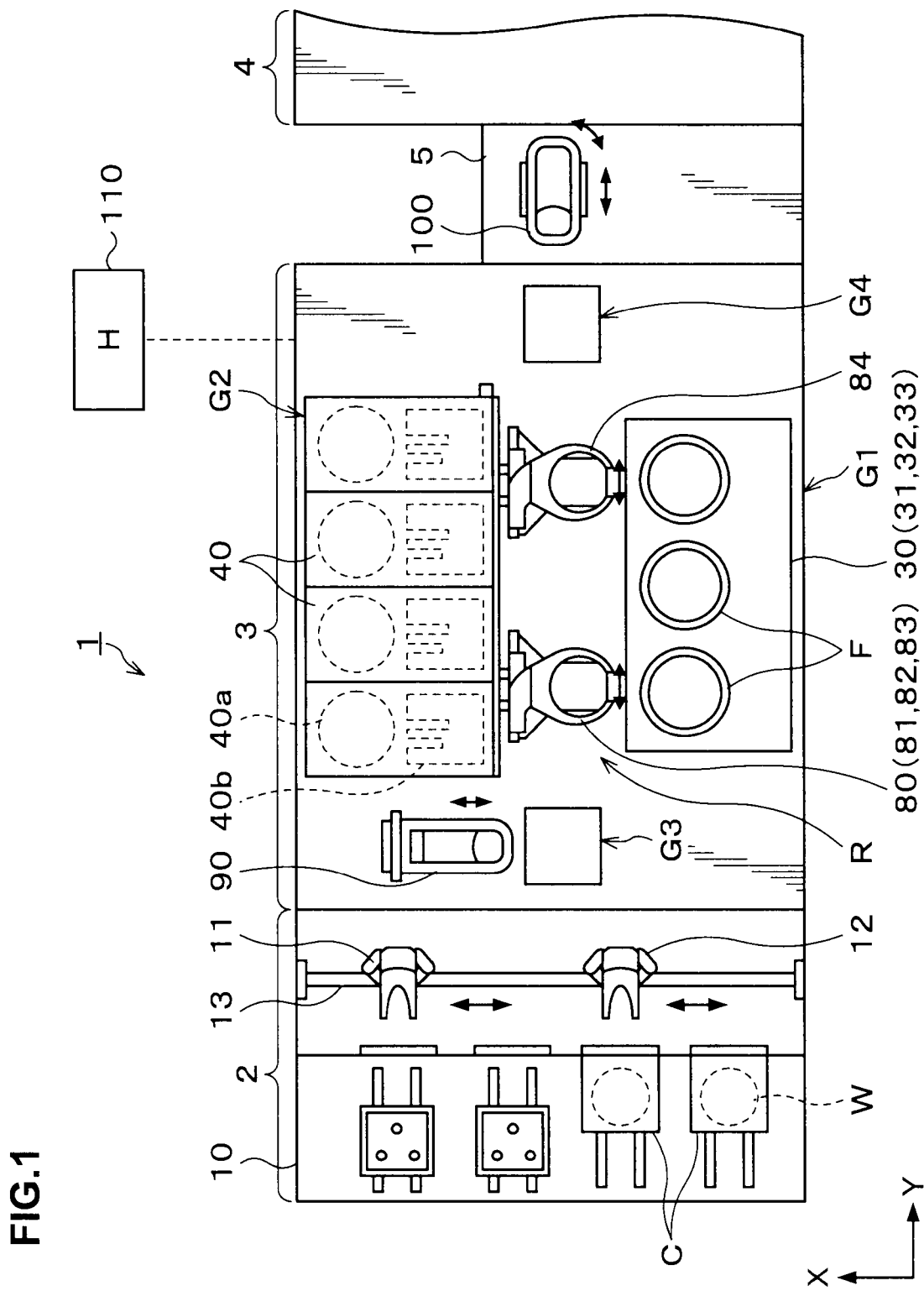
FIG. 1 is a plan view showing the outline of a configuration of a coating and developing treatment system.

Hereinafter, an embodiment of the present invention will be described. FIG. 1 is a plan view showing the outline of a configuration of a coating and developing treatment system 1 as a substrate processing system in which a substrate processing method according to the present invention is realized.

The coating and developing treatment system 1 has, as shown in FIG. 1, a configuration in which, for example, a cassette station 2 for transferring a plurality of wafers W per cassette as a unit, for example, from/to the outside into/from the coating and developing treatment system 1; a processing station 3 including a plurality of various kinds of processing and treatment units for performing predetermined processing or treatment in a manner of single wafer processing in the photolithography processing; and an interface station 5 for delivering the wafers W to/from an aligner adjacent 4 to the processing station 3, are integrally connected together.

In the cassette station 2, a cassette mounting table 10 is provided on which a plurality of cassettes C can be mounted in a line in an X-direction (a top-to-bottom direction in FIG. 1). In the cassette station 2, for example, two wafer transfer units 11 and 12 are provided. The first wafer transfer unit 11 and the first wafer transfer unit 12 are movable on a transfer path 13 extending in the X-direction. The first and second wafer transfer units 11 and 12 have transfer arms which are movable in the horizontal direction and the vertical direction and around a vertical axis (a θ-direction), and can transfer the wafer W to delivery units included in a later-described third block G3 in the processing station 3.

The processing station 3 includes a plurality of, for example, four blocks G1, G2, G3 and G4 each including various processing and treatment units. On the front side (the side of the negative direction in the X-direction in FIG. 1) in the processing station 3, the first block G1 is provided, and on the rear side (the side of the positive direction in the X-direction in FIG. 1) in the processing station 3, the second block G2 is provided. Further, on the side of the cassette station 2 side (the side of the negative direction in the Y-direction in FIG. 1) in the processing station 3, the third block G3 is provided, and on the side of the interface station 5 side (the side of the positive direction in the Y-direction in FIG. 1) in the processing station 3, the fourth block G4 is provided.

Figure 2:
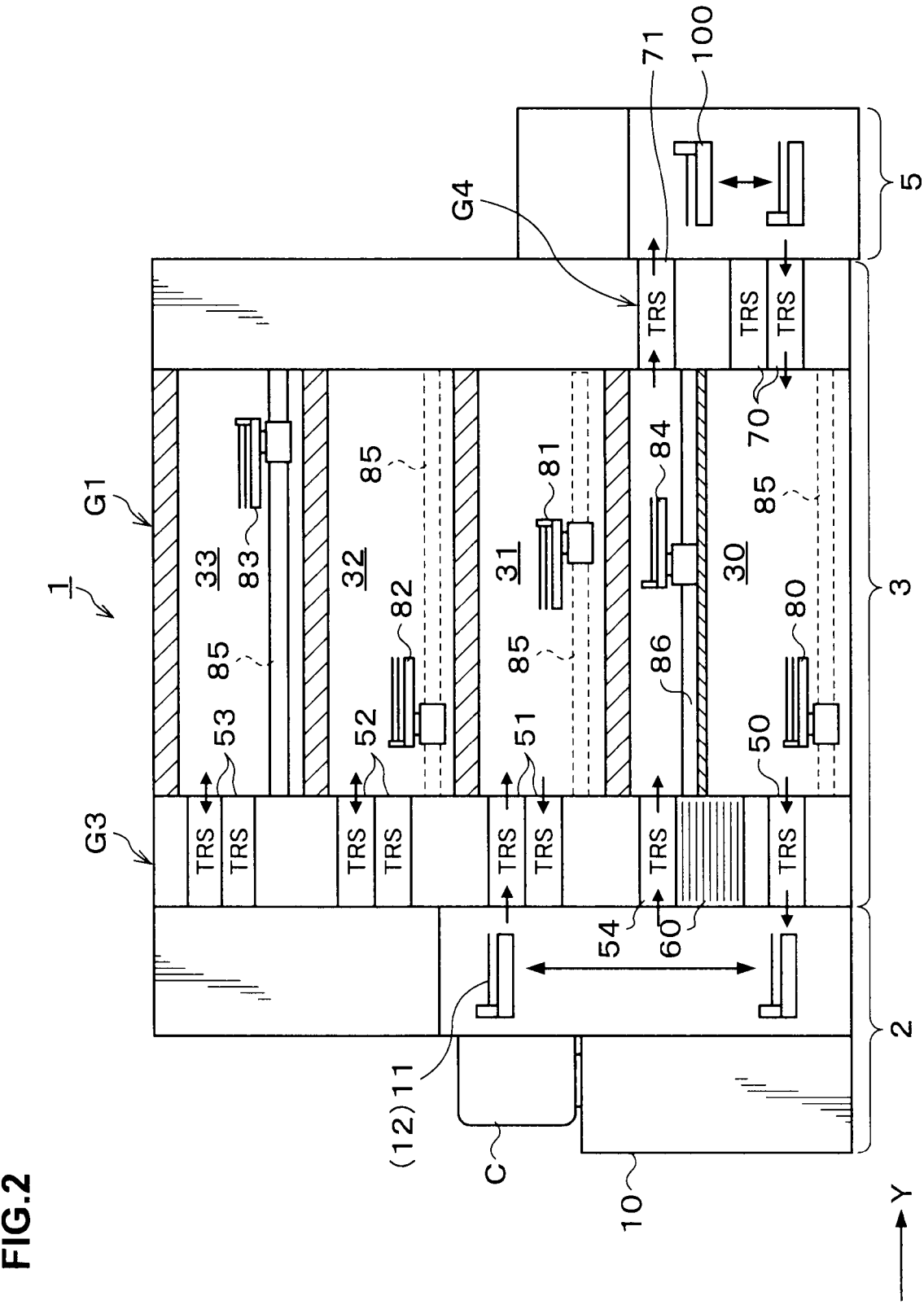
FIG. 2 is a side view showing the outline of a configuration the coating and developing treatment system.

For example, in the first block G1, as shown in FIG. 2, a plurality of solution treatment units, for example, a developing unit 30 for performing developing treatment on the wafer W, a lower anti-reflection film forming unit 31 for forming an anti-reflection film under a resist film above the wafer W (hereinafter, referred to as a "lower anti-reflection film"), a resist coating unit 32 for applying a resist solution onto the wafer W to form a resist film, and an upper anti-reflection film forming unit 33 for forming an anti-reflection film over the resist film above the wafer W (hereinafter, referred to as an "upper-portion anti-reflection film"), are four-tiered in order from the bottom. There is a space, for example, between the developing unit 30 and the lower anti-reflection film forming unit 31, and a later-described shuttle transfer unit 84 is placed at the height of this space.

Each of the units 30 to 33 in the first block, for example, has a plurality of cups F each for housing the wafer W therein during treatment in the horizontal direction as shown in FIG. 1 to be able to treat a plurality of wafers W in parallel.

Figure 3:
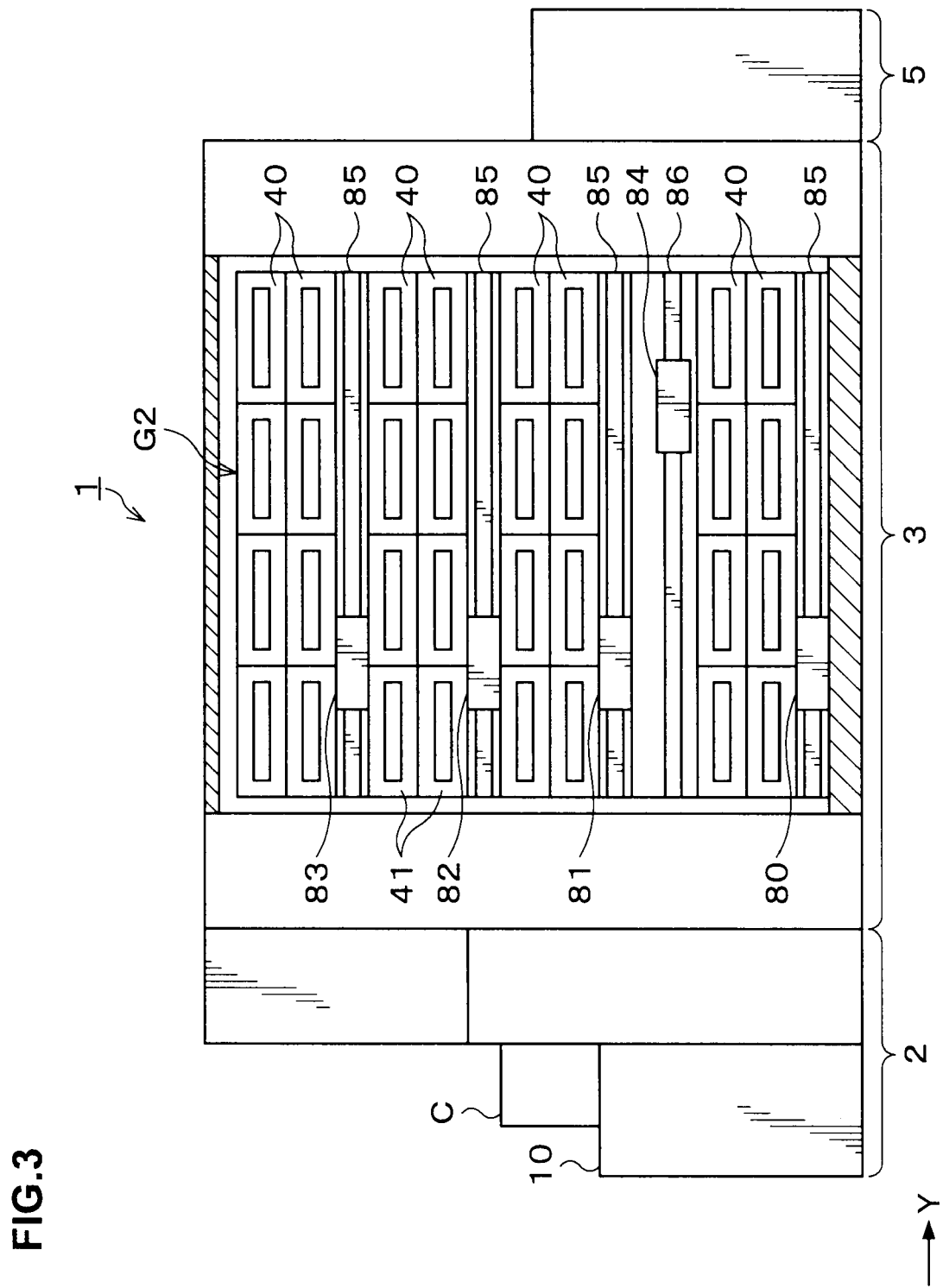
FIG. 3 is a side view of a configuration of a second block of the coating and developing treatment system.

For example, in the second block G2, as shown in FIG. 3, thermal processing units 40 each for performing heat-processing for the wafer W, and adhesion units 41 are arranged in the vertical direction and in the horizontal direction. The thermal processing units 40 are provided, for example, at the heights corresponding to the units 30 to 33 in the first block G1. Note that the numbers and the arrangements of the thermal processing units 40 and the adhesion units 41 can be arbitrarily selected. For example, the thermal processing unit 40 has a thermal plate 40a for mounting and heating the wafer W thereon and a cooling plate 40a for mounting and cooling the wafer W thereon so as to be able to perform both heating and cooling.

For example, in the third block G3, as shown in FIG. 2, a plurality of delivery units 50, 51, 52, and 53 are provided in order from the bottom. The delivery units 50 to 53 are provided at the heights corresponding to the units 30 to 33 in the first block G1. Further, a delivery unit 54 is provided at a height similar to that of the shuttle transfer unit 84 between the developing unit 30 and the anti-reflection film forming unit 31. Further, in the third block G3, a buffer cassette 60 is provided as a substrate housing unit which can temporarily house a plurality of wafers W. The buffer cassette 60 is provided at a height similar to that of the shuttle transfer unit 84.

For example, in the fourth block G4, a plurality of delivery units 70 and 71 are provided in order from the bottom. The delivery units 70 are provided at heights similar to that of the developing unit 30, and the delivery unit 71 is provided at a height similar to that of the shuttle transfer unit 84 in the first block G1.

As shown in FIG. 1, between the first block G1 and the second block G2, a transfer path R extending in the Y-direction is provided. In the transfer path R, for example, main transfer units 80, 81, 82, and 83 and the shuttle transfer unit 84 are arranged.

The main transfer units 80, 81, 82, and 83 are provided in order from the bottom, for example, as shown in FIG. 2, and provided at heights corresponding to the units 30, 31, 32, and 33 in the first block G1, respectively.

Figure 4:
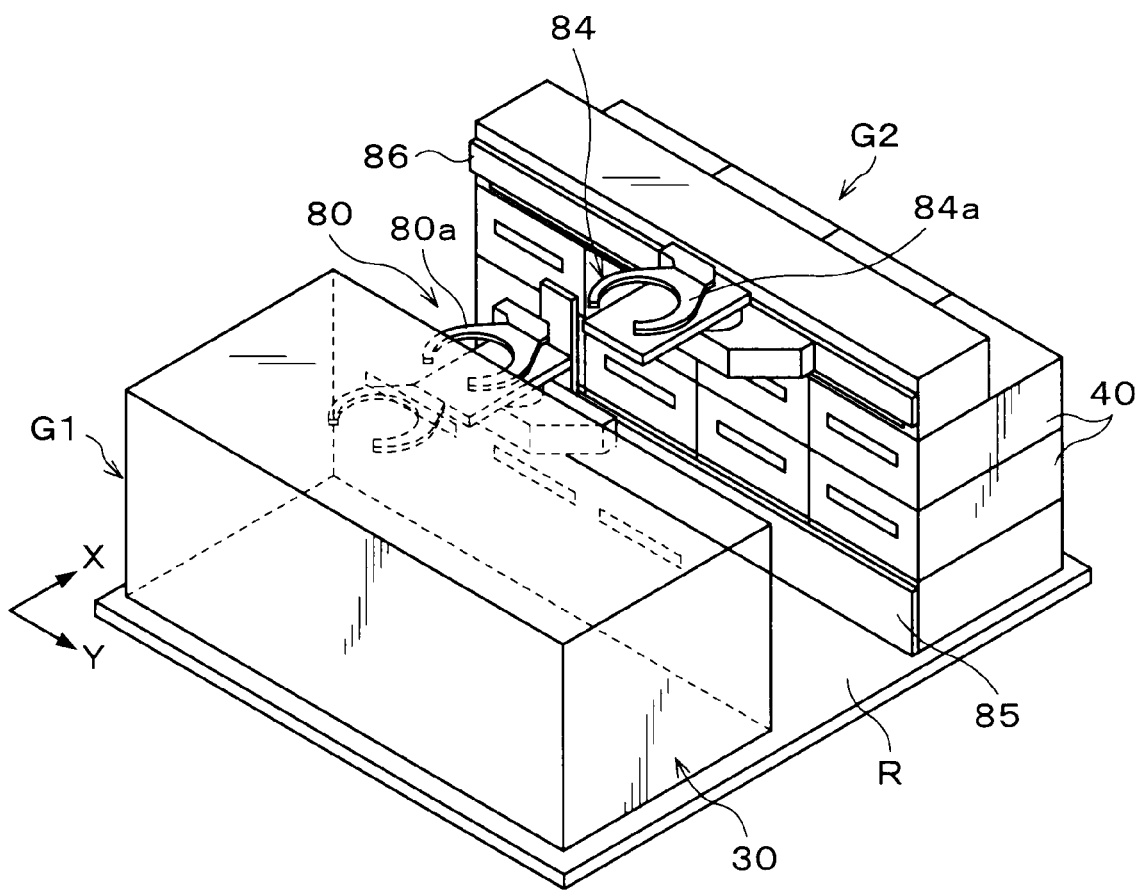
FIG. 4 is an explanatory view showing an arrangement of a developing unit in a first block, thermal processing units in the second block, a main transfer unit and a shuttle transfer unit.

For example, the main transfer unit 80 has a main transfer arm 80a that is movable in the vertical direction, the horizontal direction and the θ-direction, for example, as shown in FIG. 2 and FIG. 4. The main transfer unit 80 is movable on a rail 85 extending in the Y-direction attached to the second block G2, for example, as shown in FIG. 4. The main transfer unit 80 can move in the transfer path R and transfer the wafer W between units in the first block G1, the second block G2, the third block G3 and the fourth block G4. The main transfer units 81 to 83 have the same configuration as that of the main transfer unit 80 and can thus move on rails 85 extending in the Y-direction as shown in FIG. 2 and transfer the wafer W between units in the first block G1, the second block G2, the third block G3 and the fourth block G4.

The shuttle transfer unit 84 is provided between the main transfer unit 80 and the main transfer unit 81. Not-shown partition plates are provided between the moving region of the shuttle transfer unit 84 and the moving region of the main transfer unit 80, and between the moving region of the shuttle transfer unit 84 and the moving region of the main transfer unit 81.

The shuttle transfer unit 84 has a shuttle transfer arm 84a that is movable in the horizontal direction and the θ-direction, for example, as shown in FIG. 4. The shuttle transfer unit 84 is movable on a rail 86 extending in the Y-direction attached to the second block G2, for example, as shown in FIG. 4. The shuttle transfer unit 84 can move in the transfer path R and transfer the wafer W between the delivery unit 54 in the third block G3 or the buffer cassette 60 and the delivery unit 71 in the fourth block G4.

As shown in FIG. 1, a wafer transfer unit 90 is provided adjacent to the third block G3. The wafer transfer unit 90 has a transfer arm that is movable in the vertical direction and the horizontal direction, for example, and can transfer the wafer W between the delivery units 50 to 54 in the third block G3 and the buffer cassette 60.

In the interface station 5, a wafer transfer unit 100 is provided. The wafer transfer unit 100 has a transfer arm that is movable in the vertical direction, the horizontal direction and the θ-direction, and can transfer the wafer W between the aligner 4 adjacent to the interface station 5 and the delivery units 70 and 71 in the fourth block G4.

The above-described operation of the coating and developing treatment system 1, the operations of the various kinds of units and transfer units in the processing station 3 are controlled, for example, by a control unit 110 shown in FIG. 1. The control unit 110 is composed of a computer including, for example, a CPU and a memory, and can execute programs stored in the memory to realize a method of processing the wafer W in the coating and developing treatment system 1. The various programs for realizing the method of processing the wafer W are those stored in a storage medium H such as a computer-readable CD and installed from the storage medium H into the control unit 110 for use.

The control unit 110, for example, controls the throughput of wafer processing (the number of wafers processed per unit time) in the coating and developing treatment system 1. In the control unit 110, a throughput A of a pre-stage processing P1 performed from when the wafer W is transferred from the cassette station 2 into the processing station 3 to when it is transferred into the aligner 4 and a throughput B of a post-stage processing P2 from when the wafer W is returned from the aligner 4 into the processing station 3 to when it is returned into the cassette station 2 are separately stored such that the throughput A of the pre-stage processing P1 is higher than the throughput B of the post-stage processing P2.

Note that in this embodiment, the pre-stage processing P1 includes, for example, a later-described temperature adjustment processing S1 to heat-processing S8, and the post-stage processing P2 includes a post-exposure baking processing S10 to a post-baking processing S12.

Next, the method of processing the wafer W performed using the coating and developing treatment system 1 configured as described above will be described.

Figure 5:
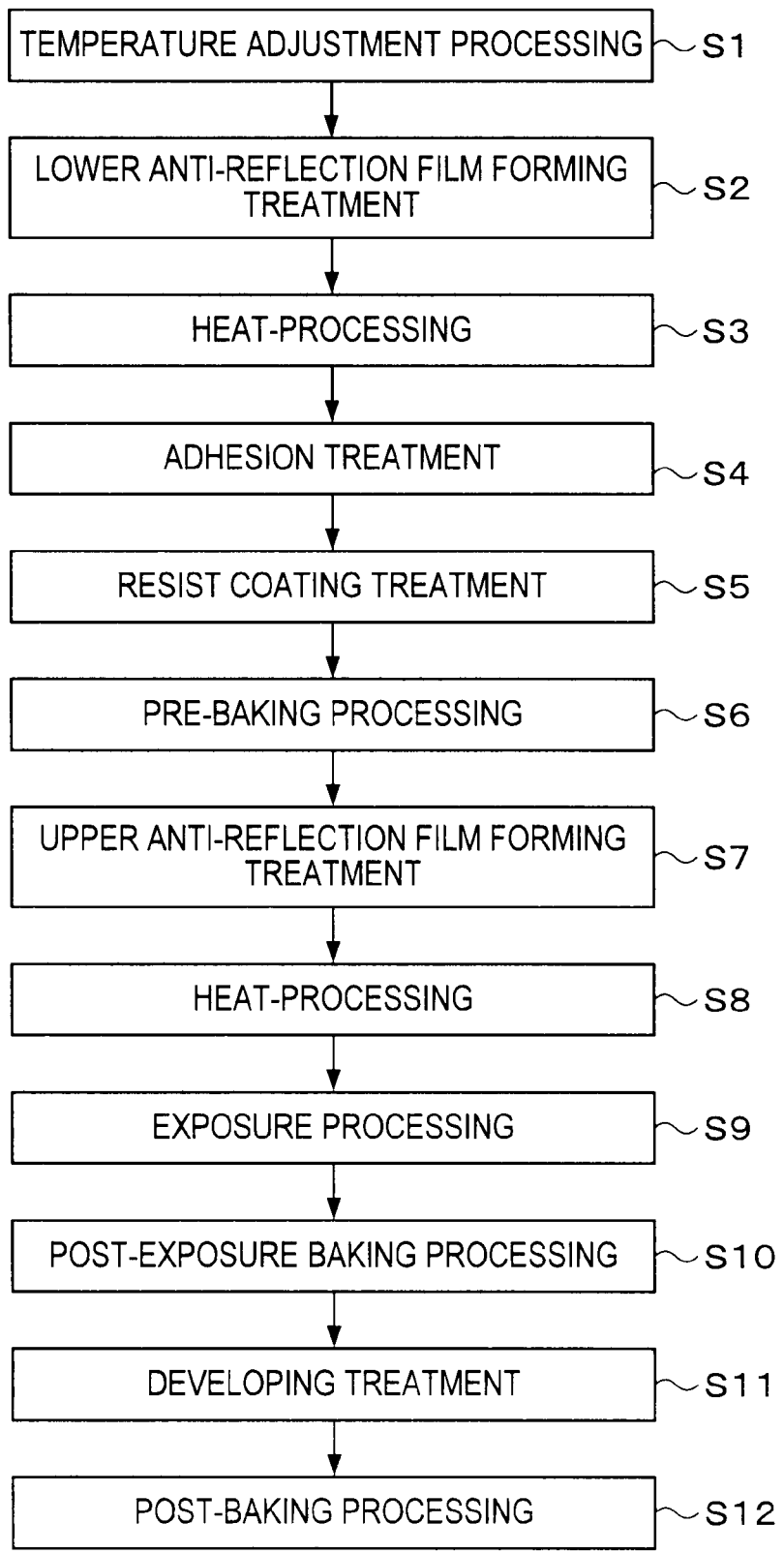
FIG. 5 is a flowchart of photolithography processing in this embodiment.

First, photolithography processing performed in the coating and developing treatment system 1 will be described. FIG. 5 is a flow showing main steps of the photolithography processing. As shown in FIG. 1, a cassette C housing a plurality of unprocessed wafers W is mounted on the cassette mounting table 10 in the cassette station 2. Each of the wafers W in the cassette C is then transferred by the first wafer transfer unit 11 to the delivery unit 51 in the third block G3 in the processing station 3. The wafer W is then transferred by the main transfer unit 81, for example, into the thermal processing unit 40 in the second block G2 and adjusted in temperature (Step S1 in FIG. 5). The wafer W is then transferred by the main transfer unit 81 into the lower anti-reflection film forming unit 31, where a lower anti-reflection film is formed on the wafer W (Step S2 in FIG. 5). The wafer W is then transferred again to the thermal processing unit 40 and heated (Step S3 in FIG. 5) and the returned to the delivery unit 51.

Subsequently, the wafer W is transferred by the wafer transfer unit 90 to the delivery unit 52. The wafer W is then transferred by the main transfer unit 82 to the adhesion unit 41 and subjected to adhesion treatment (Step S4 in FIG. 5). Subsequently, the wafer W is transferred by the main transfer unit 82 to the thermal processing unit 40 and adjusted in temperature, and thereafter transferred to the resist coating unit 32, where a resist film is formed above the wafer W (Step S5 in FIG. 5). The wafer W is then transferred by the main transfer unit 82 to the thermal processing unit 40 and heated (pre-baking processing) (Step S6 in FIG. 5) and then returned to the delivery unit 52.

Subsequently, the wafer W is transferred by the wafer transfer unit 90 to the delivery unit 53. The wafer W is then transferred by the main transfer unit 83 to the upper anti-reflection forming unit 33, where an upper anti-reflection film is formed above the wafer W (Step S7 in FIG. 5). The wafer W is then transferred by the main transfer unit 83 to the thermal processing unit 40 and heated (Step S8 in FIG. 5) and then returned to the delivery unit 53. Thus, the pre-stage processing P1 (Step S1 to Step S8) in the photolithography processing ends.

The wafer W is then transferred by the wafer transfer unit 90, for example, to the buffer cassette 60 and temporarily stored therein. The wafer W is then transferred by the wafer transfer unit 90 to the delivery unit 54, and transferred by the shuttle transfer unit 84 to the delivery unit 71 in the fourth block G4. The wafer W is then transferred by the wafer transfer unit 100 in the interface station 100 to the aligner 4 and subjected to exposure processing therein (Step S9 in FIG. 5).

Subsequently, the wafer W is transferred by the wafer transfer unit 100 from the aligner 4 to the delivery unit 70 in the fourth block G4 in the processing station 3. The wafer W is then transferred by the main transfer unit 80 to the thermal processing unit 40 and heated (post-exposure baking processing) (Step S10 in FIG. 5). The wafer W is then transferred by the main transfer unit 80 to the developing unit 30 and developed (step S11 in FIG. 5). After the development, the wafer W is transferred by the main transfer unit 80 to the thermal processing unit 40 and heated (post-baking processing) (Step S12 in FIG. 5). Thus, the post-stage processing P2 (Step S10 to Step S12) in the photolithography processing ends.

The wafer W is then transferred by the main transfer unit 80 to the delivery unit 50 in the third block G3, and then returned by the second wafer transfer unit 12 in the cassette station 2 to the cassette C on the cassette mounting table 10. Thus, the wafer processing being a series of photolithography processing ends.

Figure 6:
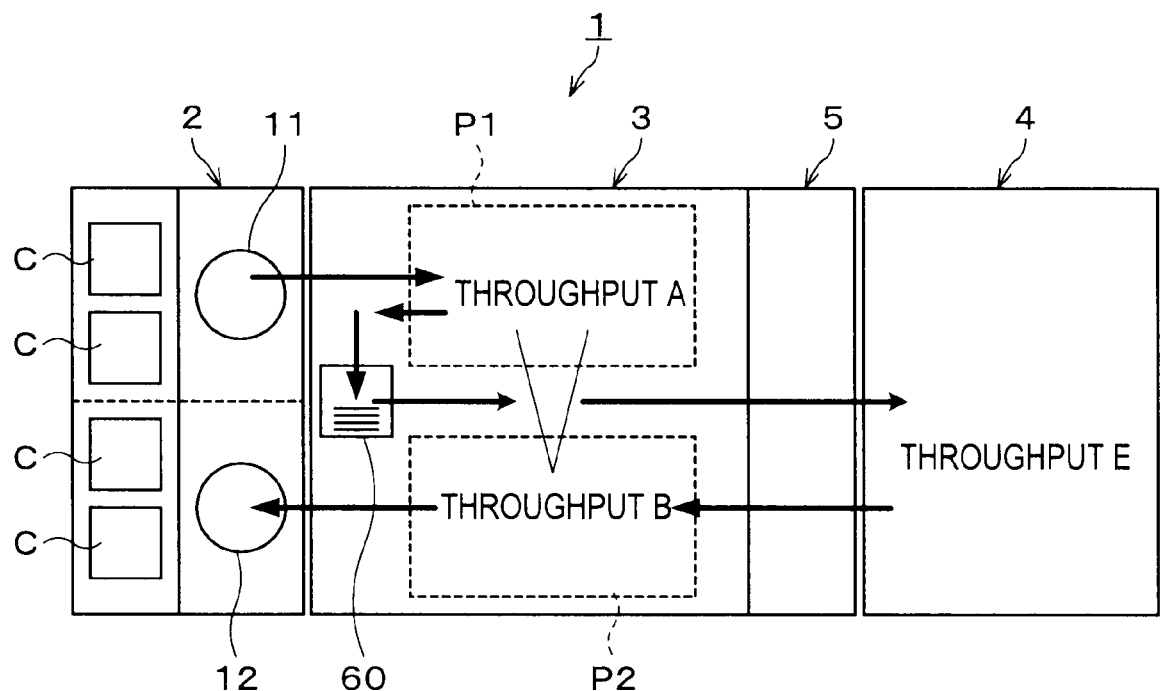
FIG. 6 is an explanatory view schematically showing a processing path of the photolithography processing in the coating and developing treatment system and the relation between a pre-stage processing and a post-stage processing.

In the wafer processing in the coating and developing treatment system 1, a plurality of wafers W are successively processed through a predetermined path as shown in FIG. 6 in which the throughput A of the pre-stage processing P1 is set higher than the throughput B of the post-stage processing P2 and a throughput E of the exposure processing. Further, the throughput B of the post-stage processing P2 is set the same as or higher than the throughput E of the exposure processing.

The number of wafers W processed per unit time in the pre-stage processing P1 is therefore larger than those of the post-stage processing P2 and the exposure processing, so that the wafers W for which the pre-stage processing P1 has been finished in the processing station 3 and which wait for the subsequent exposure processing are housed in the buffer cassette 60. As time passes, more wafers W are stored in the buffer cassette 60.

Then, when maintenance is performed, for example, for the resist coating unit 32, the lower anti-reflection film forming unit 31, and the upper anti-reflection forming unit 33 which perform the pre-stage processing P1, only those units which perform the pre-stage processing P1 are stopped. The units which perform the post-stage processing P2, such as the developing unit 30, and the aligner 4 are continuously operated, and the wafers W stored in the buffer cassette 60 are successively transferred to aligner 4 and subjected to exposure processing, and then transferred to the processing station 3 and subjected to the post-stage processing P2. Thereafter, after the maintenance for the units which perform the pre-stage processing P1 is completed, those units which perform the pre-stage processing P1 are operated again, and wafers W are stored in the buffer cassette 60.

Figure 7:
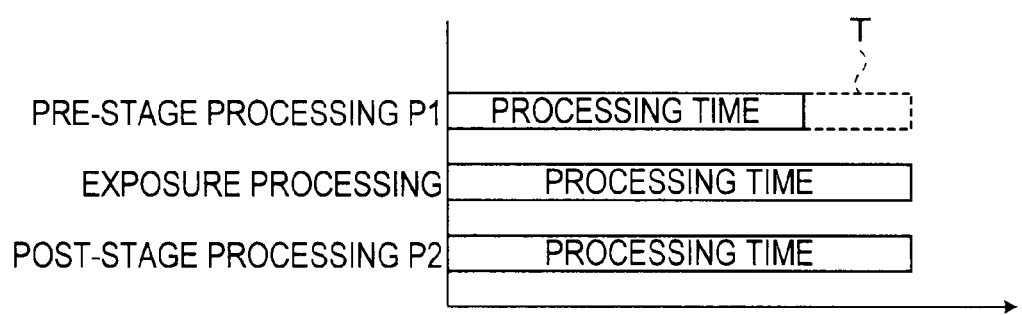
FIG. 7 is an explanatory view showing processing times for a fixed number of wafers in the pre-stage processing, exposure processing and the post-stage processing.

According to the above embodiment, the throughput A of the pre-stage processing P1 is set higher than the throughput B of the post-stage processing P2, so that the number of wafers processed per unit time in the pre-stage processing P1 is larger and the time required for wafer processing of a fixed number of wafers is shorter than those of the post-stage processing P2 and as shown in FIG. 7. This can ensure a maintenance time T for the units which perform the pre-stage processing P1. In other words, during normal operation, the pre-stage processing P1 is performed at the high throughput and the wafers W for which the pre-stage processing P1 has been finished are stored in the buffer cassette 60, thereby ensuring the maintenance time T for the units which perform the pre-stage processing P1. Then, during the maintenance time, the exposure processing and the post-stage processing P2 can be performed for the stored wafers W. This allows maintenance to be performed without stopping the wafer processing. Accordingly, a decrease in productivity of wafer products due to the maintenance can be suppressed without decreasing the throughput of the whole photolithography processing.

In the above embodiment, the wafers W for which the pre-stage processing P1 has been finished are stored in the buffer cassette 60, thereby allowing the wafers W in the buffer cassette 60 to be transferred and the exposure processing and the post-stage processing P2 to be continued for them during the maintenance. This can preferably prevent a decrease in throughput of the wafer processing due to maintenance.

Since the throughput B of the post-stage processing P2 is set the same as or higher than the throughput E of the exposure processing, the exposure processing and the post-stage processing P2 after the pre-stage processing P1 can be efficiently performed without waiting time.

Further, it is necessary to perform maintenance frequently for the resist coating unit 32 which performs the pre-stage processing P1 in the photolithography processing, and therefore it is a great advantage to apply the present invention to the wafer processing to perform the photolithography processing as in this embodiment.

Note that a wafer transfer system used for performing the pre-stage processing P1 and a wafer transfer system used for performing the post-stage processing P2 are independent from each other so that they can be separately controlled in the coating and developing treatment system 1 in this embodiment, thereby easily realizing change the throughput between the pre-stage processing P1 and the post-stage processing P2 as in the present invention.

Since the first wafer transfer unit 11 transferring the wafer W from the cassette C in the cassette station 2 to the processing station 3 and the second wafer transfer unit 12 transferring the wafer W from the processing station 3 to the cassette C in the cassette station 2 are separately provided in the coating and developing treatment system 1 described in the above embodiment, the transfer of the wafers W between the cassette station 2 and the processing station 3 can be preferably performed even if the throughputs of the pre-stage processing P1 and the post-stage processing P2 are different.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention. For example, the kinds and the number of processing and treatments in the pre-stage processing P1 and the kinds and the number of processing and treatments in the post-stage processing P2 are not limited to those described in the above embodiment. Further, the configuration of the coating and developing treatment system 1 is not limited to that described in the above embodiment. Though the substrate processing system in the above embodiment is a coating and developing treatment system which performs photolithography processing, a system performing other processing may be employed. Furthermore, the present invention is also applicable to a processing system for substrates other than the semiconductor wafer, such as an FPD (Flat Panel Display), a mask reticle for a photomask, and the like.

The present invention is useful in suppressing a decrease in productivity of substrate products due to maintenance in a substrate processing system.

What is claimed is:

1. A substrate processing method of, through use of a substrate processing system including a transfer-in/out section for transferring-in/out a substrate and a processing section for performing a plurality of processing and treatments on the substrate, comprising:

performing, in the processing section, a first treatment on a substrate transferred thereinto from the transfer-in/out section;

storing, in a substrate housing unit, the substrate after the first treatment is finished;

transferring the substrate out from the substrate housing unit to an external apparatus to perform exposure processing;

after the exposure processing, transferring the substrate from the external apparatus to the processing section and performing, in the processing section, a second treatment on the substrate returned from the external apparatus into the processing section, and returning the substrate into the transfer-in/out section;

controlling, at a control unit, a throughput of substrate processing at a pre-stage performed corresponding to the first treatment from when the substrate is transferred into the processing section from the transfer-in/out section to when the substrate is transferred out to the external apparatus to be higher than a throughput of substrate processing at a post-stage performed corresponding to the second treatment from when the substrate is returned from the external apparatus into the processing section to when the substrate is returned into the transfer-in/out section, wherein, the substrate processing system performs photolithography processing;

the first treatment is a resist film forming treatment of forming a resist film on the substrate, the first treatment including heat processing;

the second treatment is a developing treatment for the substrate; and the external apparatus is an aligner and the exposure processing includes exposing the substrate to light.

2. The substrate processing method as set forth in claim 1, wherein the throughput of the substrate processing at the post-stage is set same as or higher than a throughput of substrate processing in the external apparatus.

3. The substrate processing method as set forth in claim 1, further comprising:

stopping at least one unit used for the first treatment while continuing to perform processing for the second treatment to perform maintenance on the at least one unit.

4. The substrate processing method as set forth in claim 1, wherein the control unit controls the throughput of substrate processing at the pre-stage to be higher than the throughput of substrate processing at the post-stage, such that a plurality of substrates accumulate in the substrate housing unit.

5. The substrate processing method as set forth in claim 1, wherein a wafer transfer system used for performing the pre-stage processing and a wafer transfer system used for the post-stage processing are independent from each other and separately controlled.

6. A substrate processing system comprising:

a transfer-in/out section configured to transfer-in/out a substrate;

a processing section configured to perform a plurality of processing and treatments on the substrate, for performing in the processing section a first treatment on a substrate transferred thereinto from the transfer-in/out section, transferring the substrate out from the processing section to an external apparatus, then performing in the processing section a second treatment on the substrate returned from the external apparatus into the processing section, and returning the substrate into the transfer-in/out section;

a substrate housing unit, in the processing section, configured to store the substrate after the first treatment is finished, wherein the processing section is configured to transfer the substrate from the substrate housing unit to the external apparatus to perform exposure processing;

a control unit configured to control a setting such that a throughput of substrate processing at a pre-stage performed corresponding to the first treatment from when the substrate is transferred into the processing section from the transfer-in/out section to when the substrate is transferred out to the external apparatus is set higher than a throughput of substrate processing at a post-stage performed corresponding to the second treatment from when the substrate is returned from the external apparatus into the processing section to when the substrate is returned into the transfer-in/out section, wherein, the substrate processing system performs photolithography processing;

the first treatment is a resist film forming treatment of forming a resist film on the substrate, the first treatment including heat processing;

the second treatment is a developing treatment for the substrate; and the external apparatus is an aligner and the exposure processing includes exposing the substrate to light.

7. The substrate processing system as set forth in claim 6, wherein the throughput of the substrate processing at the post-stage is set same as or higher than a throughput of substrate processing in the external apparatus.

8. The substrate processing system as set forth in claim 6, wherein a first transfer unit transferring the substrate in the transfer-in/out section to the processing section and a second transfer unit transferring the substrate in the processing section to the transfer-in/out section are provided in said transfer-in/out section.

9. A computer-readable storage medium storing a program running on a computer of a control unit controlling a substrate processing system to cause the substrate processing system to execute a substrate processing method, said substrate processing system including a transfer-in/out section for transferring-in/out a substrate and a processing section for performing a plurality of processing and treatments on the substrate, said substrate processing method comprising:

performing, in the processing section, a first treatment on a substrate transferred thereinto from the transfer-in/out section;

storing, in a substrate housing unit, the substrate after the first treatment is finished;

transferring the substrate out from the substrate housing unit to an external apparatus to perform exposure processing;

after the exposure processing, transferring the substrate from the external apparatus to the processing section and performing, in the processing section, a second treatment on the substrate returned from the external apparatus into the processing section, and returning the substrate into the transfer-in/out section;

controlling, at the control unit, a throughput of substrate processing at a pre-stage performed corresponding to the first treatment from when the substrate is transferred into the processing section from the transfer-in/out section to when the substrate is transferred out to the external apparatus to be higher than a throughput of substrate processing at a post-stage performed corresponding to the second treatment from when the substrate is returned from the external apparatus into the processing section to when the substrate is returned into the transfer-in/out section wherein, the substrate processing system performs photolithography processing;

the first treatment is a resist film forming treatment of forming a resist film on the substrate, the first treatment including heat processing;

the second treatment is a developing treatment for the substrate; and the external apparatus is an aligner and the exposure processing includes exposing the substrate to light.

* * * * *